United States Patent [19]
Blalock et al.

[11] Patent Number: 5,783,100
[45] Date of Patent: Jul. 21, 1998

[54] METHOD OF HIGH DENSITY PLASMA ETCHING FOR SEMICONDUCTOR MANUFACTURE

[75] Inventors: Guy Blalock; Kevin Donohoe, both of Boise, Id.

[73] Assignee: Micron Display Technology, Inc., Boise, Id.

[21] Appl. No.: 752,064

[22] Filed: Nov. 19, 1996

Related U.S. Application Data

[63] Continuation of Ser. No. 213,556, Mar. 16, 1994, abandoned.

[51] Int. Cl.$^6$ .................................................... H01L 21/02
[52] U.S. Cl. .................... 216/67; 156/345 MG; 156/345 P; 156/643.1; 156/646.1; 216/74; 216/79
[58] Field of Search ............................. 216/67, 74, 79; 156/643.1, 646.1, 345 P, 345 MG

[56] References Cited

U.S. PATENT DOCUMENTS

| | | | |
|---|---|---|---|
| 4,512,868 | 4/1985 | Fujimura et al. | 156/345 |
| 4,609,428 | 9/1986 | Fujimura | 156/643.1 |
| 4,859,303 | 8/1989 | Kalnitsky et al. | 156/643.1 |
| 4,971,653 | 11/1990 | Powell et al. | 156/643.1 |
| 4,985,109 | 1/1991 | Otsubo et al. | 156/643.1 |
| 4,985,112 | 1/1991 | Egitto et al. | 156/643.1 |
| 4,990,229 | 2/1991 | Campbell et al. | 204/298.06 |
| 5,024,748 | 6/1991 | Fujimura | 156/345 |
| 5,091,049 | 2/1992 | Campbell et al. | 156/643 |
| 5,114,529 | 5/1992 | Masuyama et al. | 156/643.1 |
| 5,122,251 | 6/1992 | Campbell et al. | 204/298.06 |
| 5,242,536 | 9/1993 | Schoenborn | 156/643.1 |
| 5,336,366 | 8/1994 | Cain et al. | 156/345 P |
| 5,385,624 | 1/1995 | Amemiya et al. | 156/345 P |
| 5,449,433 | 9/1995 | Donohoe | 156/643.1 |

OTHER PUBLICATIONS

Nozawa, T. et al., "ECR Plasma Etching of N+ Polysilicon Gate", Abstract No. 245, Electrochemical Society Meeting, San Franciso, CA 1993, month unavailabel pp. 356–357.

Primary Examiner—T. Tung
Attorney, Agent, or Firm—Stephen A. Gratton

[57] ABSTRACT

An improved method of high density plasma etching for etching substrates such as semiconductor wafers is provided. The method includes controlling the ratio of ions to neutrals in a high density plasma using an ion filter located in the flow path of the plasma. The ion filter is adapted to interrupt and deflect ions in the plasma while allowing neutrals to pass through to the substrate unaffected. This helps to prevent notching because a more favorable ion/neutral ratio is present at the substrate. At the same time etch selectivity is high, particularly for etching polysilicon to oxide, because current density can remain high.

15 Claims, 2 Drawing Sheets

1

METHOD OF HIGH DENSITY PLASMA ETCHING FOR SEMICONDUCTOR MANUFACTURE

CROSS-REFERENCE TO RELATED APPLICATIONS

This application is a continuation of application Ser. No. 08/213,556 filed Mar. 16, 1994, now abandoned.

FILED OF THE INVENTION

This invention relates generally to high density plasma etching and more particularly to an improved method for controlling the ratio of ions to neutrals in a plasma during high density plasma etching of semiconductor structures.

BACKGROUND OF THE INVENTION

Dry etching is frequently employed during semiconductor manufacture for forming semiconductor structures with small feature sizes. In dry etching, gases are the primary etch medium and a substrate such as a semiconductor wafer is etched without wet chemicals or rinsing. During the etching process the material to be etched is converted to gaseous byproducts which are removed by a vacuum pumping system.

One example of dry etching is plasma etching. Plasma etching systems utilize a plasma as the etching medium. As an example in a parallel plate plasma reactor, a process chamber is evacuated and a gas mixture is energized to a plasma state using a radio frequency (rf) source. The rf source is capacitively coupled to the substrate and to one electrode while the other electrode is grounded. Cathode voltages are typically on the order of several hundred volts. The gas mixture provides a medium in which a glow discharge can be initiated and maintained. In addition, the gas mixture contains one or more chemical etchants that react with and form volatile byproducts with the solid material being etched. Under these conditions the substrate is bombarded by energetic particles which arrive at a normal incidence to the substrate and produce an anisotropic etch.

Another example of dry etching is ECR (electron cyclotron resonance) etching. ECR etching systems utilize microwaves and a magnetic field to generate plasmas at low pressures. ECR systems are one particular type of high density plasma systems.

Other high density plasma etching systems utilize one energy source to generate the plasma and another energy source to accelerate ions towards the substrate. This type of system is referred to as a high density plasma system because a high-electron-density plasma is produced. In this type of high density plasma etching system, the plasma is typically generated in a separate chamber using a source of electromagnetic radiation (e.g., microwave or low frequency whistler waves). Antennae initiate wave coupling between the source and a gas injected into the chamber. Magnetic fields are often used to control the flow direction of the ions and to provide a uniform plasma density over a large circular area. The substrate is capacitively coupled to an rf bias source which accelerates etching ions contained in the plasma towards the substrate. In addition to containing the etching ions, the high density plasma also contains reactive neutrals. Both the ions and the neutrals have an effect on the etching process. The direction of the etch however, is mostly effected by the ions.

In a high density plasma etching system, the plasma current density and bias power are used to control the energy of the ions that strike the substrate. These systems are generally operated with a very high plasma density (e.g., $10^{10}$–$10^{12}$ charges/cm$^3$) and at a very low pressure (e.g., 0.1 mtorr–200 mtorr). Commercially available high density plasma etching systems, also known as "Mori Source Etchers" are manufactured by Plasma & Materials Technologies of Burbank, Calif. U.S. Pat. NOS. 4,990,229; 5,091,049 and 5,122,251 to Campbell et al., which are incorporated herein by reference, describe high density plasma etching systems.

During high density plasma etching, particularly during the etching of polysilicon over oxide, one problem that frequently occurs is referred to as "notching". FIGS. 1A–1C illustrate the notching phenomena during plasma etching of a simplified semiconductor structure. In FIG. 1A, a polysilicon layer 10 has been deposited on a substrate oxide 12 (e.g., TEOS, nitride, thermal oxide). A patterned layer of photoresist 14 is formed on the polysilicon layer 10 as an etch mask. As shown in FIG. 1B, during a plasma etching process, the polysilicon layer 10 is etched to the endpoint of the substrate oxide 10. As the etching process continues, however, notches 16, 18 (FIG. 1C) may also form in the polysilicon layer 10, at the interface with the substrate oxide 12. The notches 16, 18 physically alter the semiconductor structure and may adversely effect the electrical characteristics of the completed semiconductor devices.

This notching problem is particularly acute when the plasma is formed in a pure halogen gas such as chlorine ($Cl_2$). Chlorine is favored for etching polysilicon deposited on a vertical or retrograde topography, because isotropic stringer removal steps are known to be sucessful after an isotropic $Cl_2$ etch. Stringers comprise a residual material that is not removed during the etch process. FIG. 2 illustrates a polysilicon layer 20 that has been deposited on an oxide layer 22 having a retrograde topography (i.e., an overhang occurs). During plasma etching the polysilicon material located in an area protected by an overhanging portion 26 of the oxide layer 22 may not etch completely. This forms the stringers 24 which are shown in FIG. 2. Stringers formed of a conductive material, such as polysilicon, may cause short circuiting between adjacent areas in a semiconductor structure.

Although etching with pure chlorine gas helps to prevent stringers 24, these stringers are not always removed during an anisotropic $Cl_2$ etch. A separate step may be required to remove them. One such step uses a mixture of $Cl_2$ and $NF_3$ (or $SF_6$) to provide a controlled lateral etching.

In addition, in order to achieve a higher etch selectivity of polysilicon to oxide during pure chlorine etching, it is preferable to use high plasma powers for generating the plasma and relatively low bias power at the substrate. As the plasma power increases the ion current increases. The general trend appears to be that notching increases in intensity as the ion current increases at constant ion energy. Lowering the plasma source power and thus the ion current can reduce notching but may also reduce the etch selectivity of the polysilicon to oxide.

One prior art approach to the problem of notching is to add oxygen, nitrogen or hydrogen additives to the chlorine gas. Pure $Cl_2$ is preferred over $Cl_2$—$O_2$ or $Cl_2$—HBr mixtures however, because these mixtures prevent notching by forming a deposit on the feature sidewalls. This deposit prevents the controlled lateral etching of the stringers because it protects the stringers from the lateral etchants.

The technical article entitled "ECR Plasma Etching of N+ Polysilicon Gate" by Nozawa et al., (Electrochemical Society Meeting, San Francisco, Calif. (1993), abstract no. 245)

describes adding oxygen to the chlorine gas. It is theorized that in this system notching is reduced because the oxygen forms a protective layer of SiOx on the polysilicon sidewalls. In a similar manner, a nitrogen additive will form a protective coating of SiN. This approach, however, tends to complicate the plasma etching process and its attendant equipment. Moreover, it has not been totally effective in alleviating the notching problem. In addition, the addition of $O_2$ may form a deposit on the sidewall of the etched feature and protect the stringers from subsequent removal.

In view of these and other problems, there is a need in the art for improved methods of plasma etching. Accordingly, it is an object of the present invention to provide an improved method of high density plasma etching in which notching and stringers can be eliminated during etching of a substrate such as a semiconductor wafer.

It is yet another object of the present invention to provide a method for controlling the plasma ion to neutral ratio in a high density plasma etching system so that neutral density and power can be increased without increasing the ion current at the substrate.

It is a further object of the present invention to provide an improved method of high density plasma etching in which the etch selectivity of polysilicon to oxide is high.

It is a still further object of the present invention to provide an improved method of high density plasma etching that is simple, low cost and adaptable to large scale semiconductor manufacture.

Other objects, advantages and capabilities of the present invention will become more apparent as the description proceeds.

SUMMARY OF THE INVENTION

In accordance with the present invention an improved method of high density plasma etching for etching substrates such as semiconductor wafers is provided. The method of the invention, simply stated, comprises controlling the ratio of ions to neutrals in a high density plasma by using an ion filter located in the flow path of the plasma. The ion filter is constructed to interrupt and deflect ions contained in the plasma while allowing the neutrals to pass through unaffected. This helps to prevent notching because a more favorable ion/neutral ratio is produced at the substrate. At the same time high etch selectivity is achieved, particularly for etching polysilicon to oxide, because high plasma source powers and low bias powers can be employed without notching.

The ion filter comprises a plate structure placed between the plasma power source and the bias power source in a high density plasma etching system. The ion filter is formed with open areas which permit the free flow of neutrals to the substrate and solid areas over which a sheath forms for interrupting and deflecting the flow of ions. The ion filter may be mounted to an electrically conductive holder connected to ground. Alternately the ion filter may be mounted to an insulating holder so that the filter is at the plasma floating potential.

In an illustrative embodiment of the invention, the ion filter is formed as a plate having a pattern of through openings. The pattern and diameter of the holes, as well as the thickness of the plate, can be selected to achieve an optimum ratio of open areas to solid areas and thus an optimum ratio of ions to neutrals. In an alternate embodiment, the ion filter is formed as a screen having a predetermined ratio of open area to solid area.

DETAILED DESCRIPTION OF THE PREFERRED EMBODIMENTS

Figure 1A:
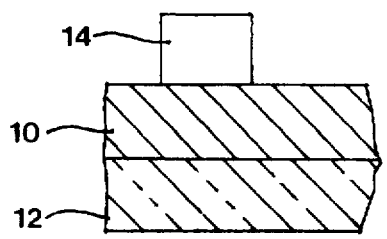
FIGS. 1A–1C are schematic cross sectional views illustrating the notching effect during a prior art plasma etching process for etching polysilicon on oxide.
Figure 1B:
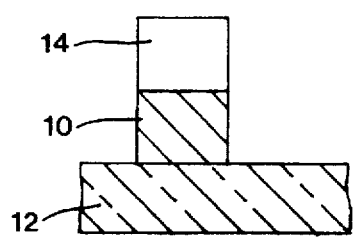
Figure 1C:
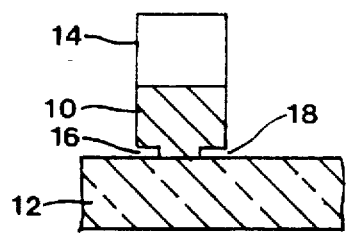
Figure 2:
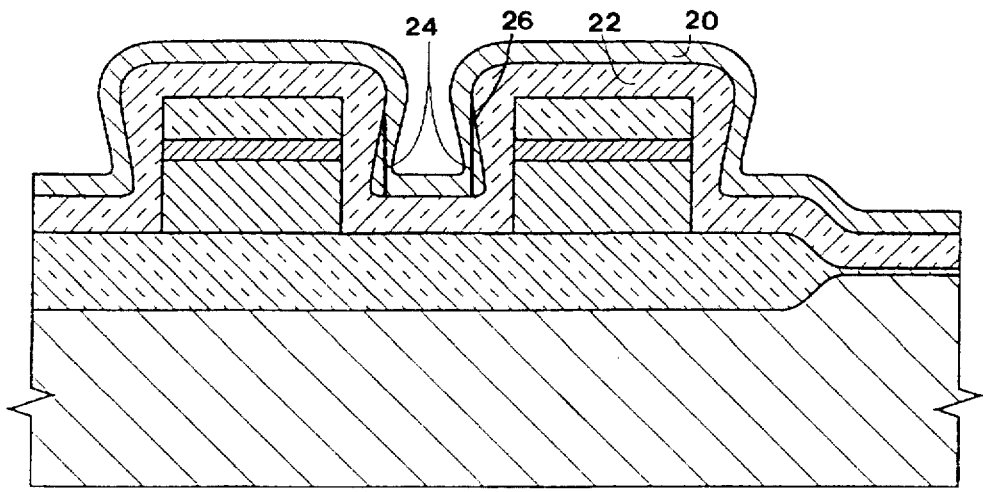
FIG. 2 is a schematic cross sectional view of a semiconductor structure illustrating the formation of stringers during a prior art plasma etching process.
Figure 3:
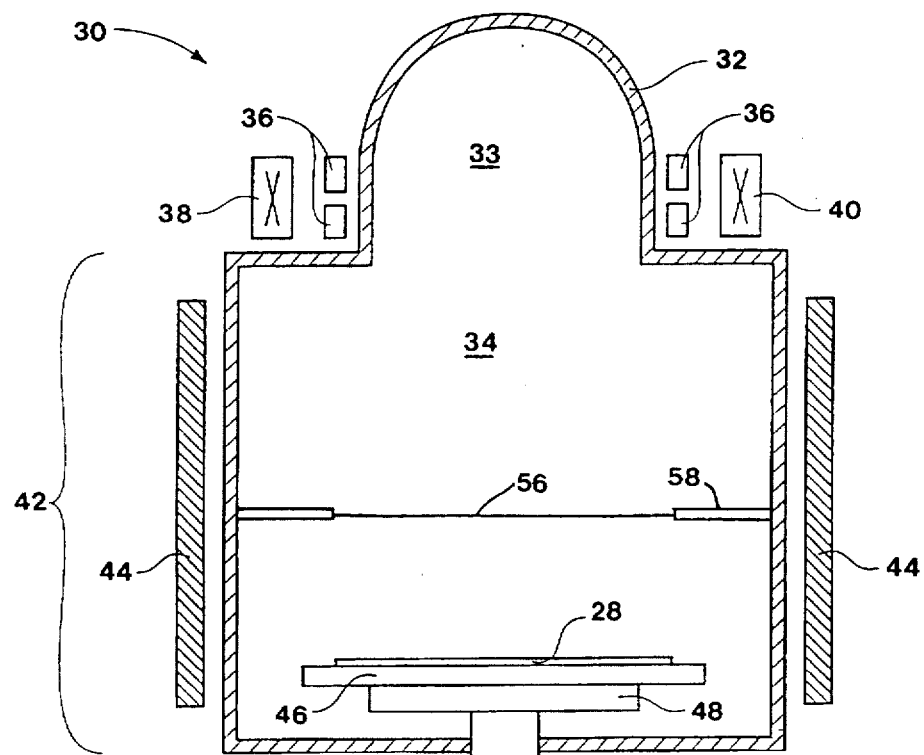
FIG. 3 is a schematic cross sectional view of a high density plasma etching system suitable for etching substrates in accordance with the method of the invention.

Referring now to FIG. 3 a high density plasma etching system 30 suitable for practicing the method of the invention is shown. The high density plasma etching system 30 includes a bell jar 32 wherein a high density plasma is generated. The high density plasma etching system 30 also includes an enclosed vacuum process chamber 34 wherein a substrate 28 (e.g., wafer) is etched.

The bell jar 32 is generally hemispherical in shape and forms a hollow plasma generating chamber 33. The bell jar 32 is made of a non-conducting material such as quartz or alumina. The bell jar 32 is coupled to a gas supply conduit (not shown) for injecting a gas or gas mixture into the plasma generating chamber 33. Antennae 36 are in electromagnetic communication with the plasma generating chamber 33 of the bell jar 32. The antennae 36 are coupled through suitable circuitry to a plasma power source (not shown) that generates electromagnetic waves such as low frequency rf whistler waves or microwaves. The antennae 36 provide highly efficient wave coupling with a gas or gas mixture injected into the plasma generating chamber 33 for establishing a high density and high current plasma. The high density plasma includes both ions and neutrals.

The chemistry of a $Cl_2$ plasma, for example, consists of chlorine atoms, chlorine ions, and excited chlorine molecules. The important etchants are the chlorine atoms and the positive chlorine ions. The negative ions can affect the plasma physics but do not strike the substrate with sufficient energy to contribute significantly to the etch process. The ratio of ions to neutrals is low because ionization requires higher electron energies than dissociation. The ion to neutral density is typically on the order of 1:1000.

An axial magnetic field is formed in the plasma generating chamber 33 of the bell jar 32 by magnetic field coils 38, 40 operably associated with the bell jar 32. The plasma formed in the plasma generating chamber is transmitted by the magnetic field into the process chamber 34.

The process chamber 34 includes a magnetic bucket system 42 with permanent magnets 44 for holding the plasma away from the process chamber walls. This prevents electron and ion loss to the walls. In addition the process chamber 34 is coupled through a conduit (not shown) to a vacuum source for establishing low pressures (e.g., 0.1 mtorr–200 mtorr) within the process chamber 34 and plasma generating chamber 33. The vacuum source also functions to exhaust byproducts created during the etching process.

The substrate 28 to be etched is mounted on a substrate holder 46 which is electrically isolated. The substrate holder 46 is formed as a metal block that is cooled or heated as required by a backside cooling/heating apparatus 48 coupled through a conduit 50 to a supply of a cooling or heating fluid. An rf bias power is applied to the substrate holder 46 and thus to the substrate 28 using an rf bias source 52. The rf bias source 52 is capacitively coupled through a connecting circuit 54 to the substrate holder 46. The rf bias source 52 functions to accelerate the ions through the process chamber 34 and to the substrate 28. The greater the rf bias the greater the energy imparted to the ions in the plasma and the greater the etch rate.

In accordance with the method of the invention an ion filter 56 is placed in the flow path of the plasma from the plasma generating chamber 33 to the substrate 28. The ion filter 56 is located downstream of the plasma generating chamber 33 and is situated generally parallel to the plane of the substrate 28. A holder 58 is provided for mounting the ion filter 56 to the walls of the plasma generating chamber 33 or to the walls of the process chamber 34. The holder 58 may be formed of an electrically conductive material, such as metal, or an electrically insulating material such as plastic. If the holder 58 is electrically conductive it must be grounded. With an electrically insulating material for the holder 58, the ion filter 56 will have a floating electric potential.

The holder 58 may be removably attached to the bell jar 32 or to the walls of the process chamber 34 utilizing any suitable fastening arrangement, such as threaded fasteners or adhesives. In addition a suitable fastening or clamping arrangement may be utilized to attach the ion filter 56 to the holder 58.

The ion filter 56 preferably has an outside diameter that is larger than an outside diameter of the substrate 28. For example, if the substrate 28 is a six inch diameter wafer, the ion filter 56 can have an outside diameter of eight inches.

Figure 4:
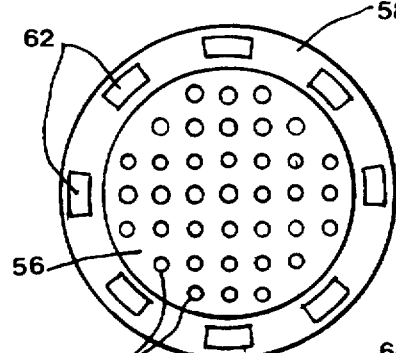
FIG. 4 is a plan view of an ion filter constructed in accordance with the invention.

FIG. 4 illustrates the ion filter 56 and holder 58 separate from the plasma etching system 30. As shown in FIG. 4, the ion filter 56 is a generally circular metal plate having a pattern of through holes 60. The holder 58 for the ion filter 56 is also circular in shape and may include cutouts 62 that allow a free flow of gases through the holder 58. The cutouts 62 help to alleviate the formation of a dead zone at an upstream end of the holder 58.

Figure 5:
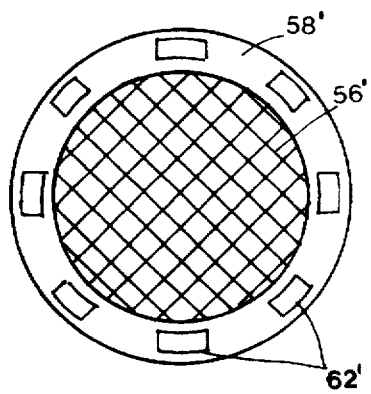
FIG. 5 is a plan view of an alternate embodiment ion filter constructed in accordance with the invention.

FIG. 5 illustrates an alternate embodiment ion filter 56' formed as a screen mesh rather than as a solid plate with holes. As an example, the screen mesh may be woven from wire having a diameter of from 0.5 mm to 4 mm, with openings as large as 20 mm.

As the plasma flows from the bell jar 32 through the ion filter 56, a sheath 64 (FIG. 6) will form around the solid areas of the ion filter 56. These solid areas include the areas between the holes 60 and the inside diameters of the holes 60. The sheath 64 will interrupt and deflect a portion of the ions. This results in fewer ions that strike the substrate. The solid areas will also interrupt the neutral flow to the wafer since they present a physical barrier. On the other hand, the neutrals present in the plasma are unimpeded by the sheath 64 existing in the inside-diameter of the holes 60 and will flow past the ion filter 56. The difference in properties between the ions and neutrals as they interact with the sheath formed by the holes yields a mechanism by which the neutral to ion ratio may be adjusted. This provides a higher ratio of neutrals to ions at the wafer surface for a given plasma condition.

The ion filter thus functions to control the ion/neutral ratio in the plasma in order to provide more favorable etching conditions at the substrate 28. Specifically a predetermined ion to neutral ratio can be achieved at high current densities which permits high etch selectivity (e.g. polysilicon to oxide) without notching. The etching gas can therefore be formed of a pure halogen, such as chlorine, bromine of fluorine, or a pure halogen compound with no need to include additive gases (i.e., oxygen, hydrogen) to overcome notching. Thus even with relatively high ion current densities and high etch rates notching is not a problem and selectivity remains high.

The number and diameter of the holes 60 for the ion filter 56 is selected to achieve an optimal ion/neutral ratio. Such a ratio can be achieved by a pattern holes 60 each having a diameter of 2 mm to 20 mm. The holes 60 are spaced in a pattern that allows a uniform distribution of gas and which permits as much gas to flow without affecting pressure and also which provides a minimal impediment of neutrals. A representative range for the open areas as a percentage of total area for the ion filter 56 is 10% to 80%.

Figure 6:
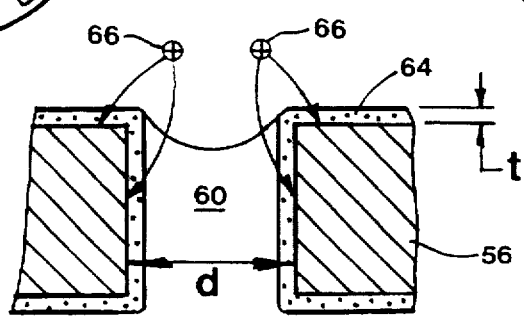
FIG. 6 is an enlarged schematic cross sectional view of a portion of the ion filter shown in FIG. 4 illustrating the formation of a sheath over the solid areas of the filter.

It is theorized that the ratio of ions/neutrals is affected not only by number and diameter of the holes but also by their depth (i.e., thickness of the ion filter 56). FIG. 6 is an enlarged cross sectional view of a hole 60 with an inside diameter of "d" formed in the ion filter 56. During steady state operation of the high density plasma etching system 30, the sheath 64 having a thickness of (t) forms around all of the solid areas of the ion filter 56 including the inside diameter of the holes 60. The thickness (t) of the sheath 64 is a function of the plasma density.

Although the overall charge of the plasma is neutral, the plasma contains both positively and negatively charged species. In common plasma etch system, the etching species will be positively charged ions 66 and reactive neutrals. Some of the positive etching ions 66 are deflected by the sheath 64 that forms over the solid areas of the ion filter 56 and along the inside diameter of the holes 60. This deflection is indicated by the flow arrows. Some of these positive etching ions 66 attach to the ion filter 56, others are randomly deflected. Neutral atoms, on the other hand, pass over the solid areas and through the open areas of the ion filter 56 substantially unaffected. This decreases the density of ions at the substrate 28 and the ratio of ions/neutrals.

Although the method of the invention has been described with reference to a particular high density plasma etching system it is to be understood that the method of the invention can be practiced with other high density etching arrangements. Thus as will be apparent to those skilled in the art certain changes and modifications can be made without departing from the scope of the invention as defined by the following claims.

What is claimed is:

1. A method for etching a substrate comprising:

providing a plasma etching system comprising a magnetic bucket system and a vacuum process chamber at a pressure of 0.1 mtorr–200 mtorr, said vacuum process chamber in flow communication with a plasma generating chamber configured to generate a plasma comprising neutrals and ions with a charge density of from $10^{10}$–$10^{12}$ charges/cm$^3$;

placing the substrate in the reaction chamber in electrical communication with a bias source;

placing an ion filter between the plasma generating chamber and substrate, said ion filter comprising a plate with a plurality of openings therethrough, said openings having inside diameters of from 2 mm to 20 mm and a combined area comprising from 10–80% of a total area of the ion filter; and accelerating the ions in a flow path towards the substrate with solid areas on the filter, including solid portions of the plate within the inside diameters of the openings, forming a sheath to interrupt and deflect the flow path of the accelerated ions in order to decrease a ratio of ions to neutrals in the plasma striking the substrate.

2. The method as recited in claim 1 wherein the ion filter comprises a holder comprising an electrically conductive material connected to ground.

3. The method as recited in claim 1 wherein the ion filter comprises a holder comprising an electrically insulating material with a floating electrical potential.

4. The method as recited in claim 1 wherein the plasma comprises a halogen gas.

5. The method as recited in claim 1 wherein the ion filter is placed generally perpendicular to the flow path and generally parallel to the substrate.

6. The method as recited in claim 5 wherein the ion filter has a diameter larger than a diameter of the substrate.

7. A method for etching a substrate comprising:

providing a plasma etching system comprising a magnetic bucket system and a plasma generating chamber at a pressure between about 0.1 mtorr–200 mtorr, said plasma generating chamber configured to generate a plasma comprising neutrals and ions with a charge density of from $10^{10}$–$10^{12}$ charges/cm$^3$;

providing a process chamber in flow communication with the plasma generating chamber, said process chamber including a substrate holder electrically connected to an rf bias source for accelerating the ions in a flow path towards the substrate;

placing an ion filter in the flow path, said ion filter comprising a screen including wire having a diameter of from 0.5 mm to 4 mm and a plurality of openings with a diameter of from 2 mm to 20 mm, said ion filter configured to interrupt and deflect the flow path of the ions in order to decrease a ratio of ions to neutrals in the plasma striking the substrate.

8. The method as recited in claim 7 wherein the ion filter is placed generally parallel to the substrate and generally perpendicular to the flow path.

9. The method as recited in claim 7 wherein the ion filter has a diameter greater than a diameter of the substrate.

10. The method as recited in claim 7 wherein the ion filter comprises a holder.

11. The method as recited in claim 10 wherein the holder comprises an electrically conductive material connected to ground.

12. The method as recited in claim 10 wherein the holder comprises an electrically insulating material with a floating electric potential.

13. The method as recited in claim 10 wherein the holder includes a plurality of cutouts.

14. An etching method comprising:

providing a substrate comprising a layer of polysilicon on an oxide layer;

providing a plasma etching system comprising a magnetic bucket system, a plasma energy source, a reaction chamber at a pressure between about 0.1 mtorr–200 mtorr, and a substrate holder electrically coupled to a bias source;

generating a plasma within the reaction chamber using the plasma energy source, said plasma comprising neutrals and ions with a charge density of from $10^{10}$–$10^{12}$ charges/cm$^3$;

directing the plasma in a flow path towards the substrate;

placing an ion filter in the flow path, said ion filter comprising an element selected from the class consisting of plates and screens, said ion filter including a plurality of openings with a diameter of from 2 mm to 20 mm and a combined area comprising from 10–80% of a total area of the ion filter, said ion filter configured to interrupt and deflect the ions in order to decrease a ratio of ions to neutrals in the plasma striking the substrate.

15. The method as claimed in claim 14 wherein the ion filter is placed within the reaction chamber generally parallel to the substrate and generally perpendicular to the flow path.

* * * * *

UNITED STATES PATENT AND TRADEMARK OFFICE
CERTIFICATE OF CORRECTION

PATENT NO. : 5,783,100
DATED : July 21, 1998
INVENTOR(S) : Guy Blalock; Kevin Donohoe It is certified that error appears in the above-identified patent and that said Letters Patent is hereby corrected as shown below:

On the title page, item[73], should read:

Assignee: Micron Technology, Inc.
                 Boise, ID.

Signed and Sealed this

Fifteenth Day of June, 1999

*Attest:*

Q. TODD DICKINSON

*Attesting Officer*      *Acting Commissioner of Patents and Trademarks*